April 18, 1961 J. W. MILLION, JR 2,980,797

VARIABLE TUNER

Filed July 17, 1958

INVENTOR
JOHN W. MILLION, JR
BY Edward M. Farrell
ATTORNEY

United States Patent Office 2,980,797

Patented Apr. 18, 1961

2,980,797

VARIABLE TUNER

John W. Million, Jr., Mount Holly, N.J., assignor, by mesne assignments, to American Bosch Arma Corporation, Hempstead, N.Y., a corporation of New York Filed July 17, 1958, Ser. No. 749,257

1 Claim. (Cl. 250—40)

Figure 1:
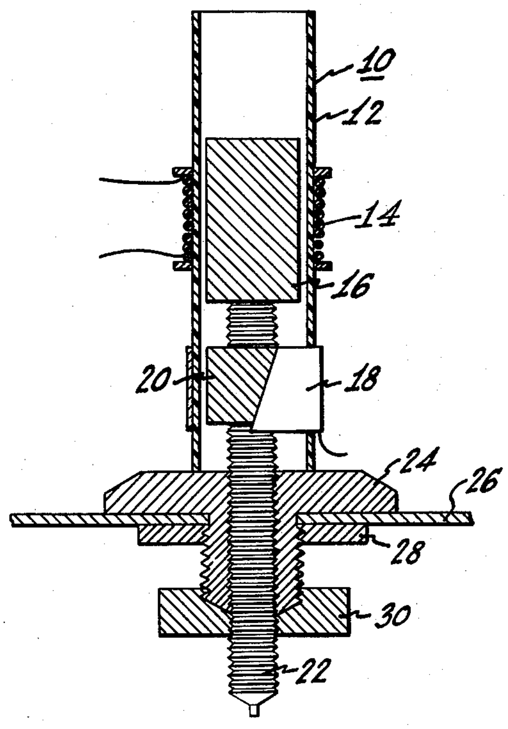

This invention relates to radio frequency tuners, and more particularly to tuners having a wide range of variable frequency operation.

Variable radio frequency tuners are used extensively in radio receivers and transmitters, as well as other types of equipment involving the use of tunable resonant circuits. In many fields, such as, for example, radio telemetry involving guided missiles, minimum size and weight of components are of prime importance.

In addition to the importance of miniaturization, standardization of particular components is also particularly desirable in cases where large quantities of components must be manufactured. In order to standardize components or systems to a high degree, it is desirable to have as many units or elements as possible operable over a wide frequency band or adaptable for different bands of operation.

Frequency tuning devices used in radio frequency amplifiers, intermediate frequency amplifier stages or oscillators, for example, should be variable over relatively wide ranges of resonant frequencies to cover different bands of operation. In most cases, the resonant frequency of such tuning devices is varied by varying the inductance or capacitance associated with the resonant circuits involved either by changing the relative position of capacitor plates or the relative position of a high permeability core with respect to a coil. In some cases, both the inductance and the capacitance associated with a resonant circuit have been varied simultaneously to provide a wider tunable frequency range of operation than that attainable through varying either the capacitance or inductance alone. In many cases, even tuning both the inductance and capacitance associated with a resonant circuit will not provide a sufficiently wide tunable range of operation to permit similar types tuners to be used for different frequency bands or to be useful over a very wide frequency range. This is especially true when very high frequency ranges are involved.

In some cases, variable frequency tuning devices involve problems relating to shielding the resonant circuit which is tuned. This is especially true in cases where the inductive element or coil is exposed to stray magnetic or electrostatic fields in high frequency operation.

It is an object of this invention to provide an improved variable frequency tuning device which is capable of being tuned over relatively wide frequency ranges.

It is a further object of this invention to provide an improved variable frequency tuning device wherein a relatively wide variable frequency range is provided with means for shielding of the resonant circuit involved.

In accordance with the present invention, a variable frequency tuning device is provided which comprises a coil and a high permeability core. A pair of elements form a variable capacitor with one of the elements being a movable non-magnetic element. A unitary control is provided to simultaneously move both the high permeability core and the non-magnetic element. Movement of the high permeability element varies the inductance of the coil while the movement of the movable non-magnetic element varies the capacitance. When the non-magnetic element is moved over a predetermined range, continued movement causes it to move adjacent the coil to decrease the inductance thereof.

Figure 2:
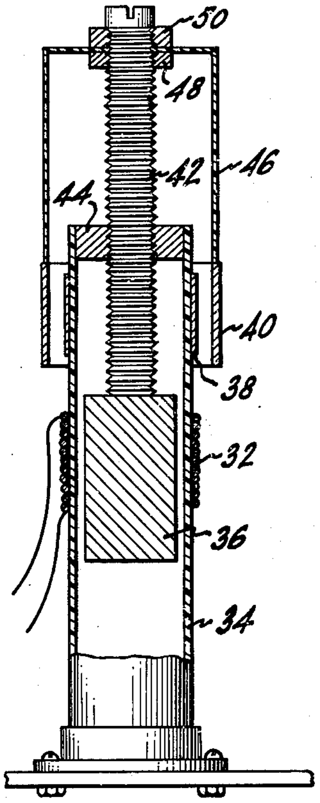

Other objects and advantages of the present invention will be apparent and suggest themselves to those skilled in the art to which the present invention is related from a reading of the following specification and claim in conjunction with the accompanying drawings, in which:

Figure 1 is a cross sectional view of a variable tuning device illustrating one form of the present invention; and, Figure 2 is a cross sectional view of a variable tuning device illustrating another form of the present invention.

Referring particularly to Figure 1, a tuner 10 comprises a tubular insulating coil form 12. A coil 14, of the solenoid type is wound on the coil form 10. A high permeability magnetic core 16 is disposed between the coil form and is adapted to be moved axially between the coil 14 to vary the inductance of the coil.

A variable capacitor comprises a metal slit ring 18 disposed around the coil form 12 and a movable non-magnetic brass slug 20. The brass slug 20 is also disposed within the coil form 12 and adapted to be moved in an axial direction to vary the capacitance between the metal slit ring 18 and the movable brass slug 20.

The magnetic core 16 and the brass slug 20 are mechanically attached to a threaded element 22 which provides a unitary control for manually moving both magnetic core 16 and the brass slug 20.

A mounting unit 24 is mounted upon a chassis 26 and is held in place by a mounting screw 28. The mounting unit 24 includes a threaded aperature centrally disposed to receive the threaded element 22. A turning of the threaded element 22, as during the initial tuning or adjustment operation, causes the magnetic core 16 and the brass slug 20 to be moved up or down in an axial direction. A lock nut 30 is provided for locking the threaded element 22 in a set position after the initial adjustment.

As is well known, the coil 14 and its associated magnetic core 16 may be associated with a tunable resonant circuit in an amplifier or oscillator circuit, for example. The variable capacitor comprising the metal slit ring 18 and the brass slug 20 may likewise be associated with a tunable resonant circuit. A slit ring, rather than a solid ring is preferable in some cases since a solid ring may tend to act as an inductance to reduce the inductance of the coil 14. In a preferred form, the variable inductance and variable capacitance may be associated with the same tunable resonant circuit although it is recognized that, in some cases, different resonant circutis may be associated wih the inductance and capacitance involved. When a single tunable resonant circuit is employed, movement of the magnetic core 16 in an upward direction out of the coil will decrease the inductance of the coil 14. At the same time, movement of the brass slug 20 away from the slit ring 18 tends to reduce the capacitance associated with these two elements due to the increased spacing therebetween.

When the magnetic core 16 has moved completely out of the coil 14 and the brass slug 20 is completely out of the slit ring 18, continued movement of the brass slug 20 in the upward direction will cause it to move within the coil 14. Since the brass slug 20 is of a non-magnetic material, its movement within the coil 14 will reduce the inductance of the coil. Thus it is seen that the present invention has provided essentially three steps to provide an extended frequency tuning range for the tuner 10. First, the inductance of the coil 14 is decreased by the movement of the magnetic core 16 from a position inside the coil to a position outside the coil. Second, the capacitance is decreased by the movement of the brass slug 20 away from the slit ring 18 due to the increased spacing between the brass slug and the slit ring. Third, continued movement of the brass slug 20 to a position inside the coil 14 further decreases the inductance of the coil.

In some cases, the slit ring 18 may be divided into two separate elements in effect providing two separate variable capacitors. Such devices may be useful in balancing networks, discriminators or "phase lock" systems.

Referring particularly to Figure 2, another form of the present invention illustrating a wide range frequency tuner including an additional feature of shielding is provided.

A coil 32 is wound upon insulated tubular form 34. A high permeability core 36 is adapted to be moved within the coil 32 to vary the inductance thereof. A variable capacitor comprises a ring 38 disposed around the coil form 34. A second movable element 40 forms part of a variable capacitor together with the ring 38. A threaded element 42 is threadedly mounted to the core 36 through an insulated ring 44 which is fit to the top of the tubular form 34. The movable element 40 is attached to an insulated cover 46. The cover 46 is mechanically mounted to the threaded element 42 and the cover 46 and is held in place by a pair of nuts 48 and 50. Turning of the threaded element 42 causes the core 36 and the movable element 40 to be moved in an up or down direction.

Movement of the core 36 in a downward direction causes it to move outside the coil thereby decreasing the inductance thereof. At the same time, movement of the element 40 away from the ring 38 decreases the capacitance between these two elements. Continued movement of the element 40 causes it to move into a position where it surrounds the coil 32. The element 40 comprises non-magnetic material, such as brass. When the element 40 moves adjacent or around the coil 32, the inductance of the coil 32 decreases. At the same time, the movement of the element 40 to a position where it is disposed around the coil 32 provides a shielding effect for the coil. Consequently, stray magnetic or electrostatic fields will tend to be isolated from the coil 32. Thus, the embodiment shown in Figure 2 provides the advantages of the tuner illustrated in Figure 1 with the additional feature of shielding.

For purposes of simplicity, various electrical connections which may be made from the elements of the tuner have not been shown or described in detail, since such connections are obvious to those skilled in the art. For example, in Figure 1 the electrical connections may be taken directly from the coil 14. The electrical connections from the variable capacitors may be made from the slit ring 18 with the other connection from the brass slug being through a ground connection from the chassis 20. In Figure 2, leads may be connected to the two ends of the coil 32. The connections from the variable capacitor may be from an electrical connection from the ring 38 and from the movable elements 40. A wire or printed circuitry technique, may be used to provide an electrical connection from the ring 40 to the nut 50 or other suitable location.

What is claimed is:

A wide range tuner comprising a hollow insulated tubular member, a coil wound around said tubular member, a high permeability core disposed within said tubular member adapted to be moved within said coil to vary the inductance thereof, a slit ring forming one plate of a variable capacitor disposed around said tubular member in a coaxial relationship with said coil, a non-magnetic metal ring disposed around said tubular member forming a second plate of a variable capacitor adapted to be moved outside of said slit ring, said non-magnetic metal ring being disposed in a coaxial relationship with said high permeability core, a unitary control for moving said core and said non-magnetic metal ring, and said unitary control being adapted to move said non-magnetic metal ring away from said slit ring to decrease the capacitance of said variable capacitor and around said coil to decrease the inductance thereof and to provide a shield therefor.

References Cited in the file of this patent

UNITED STATES PATENTS

| | | |
|---|---|---|
| 2,325,279 | Schaper | July 27, 1943 |
| 2,390,009 | Stott | Nov 27, 1945 |
| 2,394,391 | Martowicz | Feb. 5, 1946 |
| 2,737,629 | Beerbaum | Mar. 6, 1956 |
| 2,780,727 | Dreyer | Feb. 5, 1957 |
| 2,913,681 | Lyman | Nov. 17, 1959 |